United States Patent
Fukuda

[19]

[11] Patent Number: 6,127,729
[45] Date of Patent: Oct. 3, 2000

[54] SEMICONDUCTOR CHIP WITH CORNER ELECTRODE TERMINALS AND DETECTING WIRING FOR DEFECT INSPECTION

[75] Inventor: Kazuyoshi Fukuda, Tokyo, Japan

[73] Assignee: Mitsubishi Denki Kabushiki Kaisha, Tokyo, Japan

[21] Appl. No.: 09/212,264

[22] Filed: Dec. 16, 1998

[30] Foreign Application Priority Data

Jun. 29, 1998 [JP] Japan .................................. 10-183044

[51] Int. Cl.$^7$ .............................. H01L 23/48; H01L 21/66
[52] U.S. Cl. ........................... 257/736; 257/691; 257/48; 257/208; 257/210; 257/786; 257/784; 257/689; 257/688
[58] Field of Search ...................................... 257/784, 786, 257/736, 691, 692, 693, 48, 738, 737, 734, 208–211, 690, 689, 688

[56] References Cited

U.S. PATENT DOCUMENTS

| | | | |
|---|---|---|---|
| 5,399,904 | 3/1995 | Kozono | 257/666 |
| 5,455,460 | 10/1995 | Hongo et al. | 257/734 |
| 5,506,499 | 4/1996 | Puar | 324/158.1 |
| 5,585,676 | 12/1996 | Uda et al. | 257/786 |
| 5,814,891 | 9/1998 | Hirano | 257/778 |
| 5,886,409 | 3/1999 | Ishino et al. | 257/737 |
| 5,895,978 | 4/1999 | Palagonia | 257/786 |
| 5,909,034 | 6/1999 | Soldavini et al. | 257/48 |
| 5,955,789 | 9/1999 | Vendramin | 257/786 |
| 5,956,567 | 9/1999 | Tomita | 438/18 |
| 5,965,903 | 10/1999 | Chittipeddi et al. | 257/48 |

FOREIGN PATENT DOCUMENTS

| | | |
|---|---|---|
| 59-33866 | 2/1984 | Japan . |
| 4199651 | 7/1992 | Japan . |
| 50784901 | 1/1999 | Japan . |

*Primary Examiner*—Alexander O. Williams
*Attorney, Agent, or Firm*—Leydig, Voit & Mayer, Ltd.

[57] ABSTRACT

A method of inspecting a chip with projecting electrodes or bumps, part of which are lacking, includes arranging electrode terminals for detecting projecting electrodes along four corners of a peripheral edge of a rectangular semiconductor chip, measuring an electrical characteristic of each of the electrode terminals, and determining the semiconductor chip as a defective one in terms of projecting electrodes if the measured result does not conform to a desired characteristic. As another feature, the surface of the projecting electrode of the electrode terminal is flattened.

3 Claims, 10 Drawing Sheets

SEMICONDUCTOR CHIP WITH CORNER ELECTRODE TERMINALS AND DETECTING WIRING FOR DEFECT INSPECTION

BACKGROUND OF THE INVENTION

1. Field of the Invention

The present invention relates to a semiconductor chip with projecting electrodes, which contains semiconductor devices composed of electric circuits including circuit elements, such as transistors or resistors, on a semiconductor wafer and connecting the circuit elements to each other via wirings, and a method of inspecting the semiconductor chip with projecting electrodes.

2. Description of the Prior Art

Figure 12:
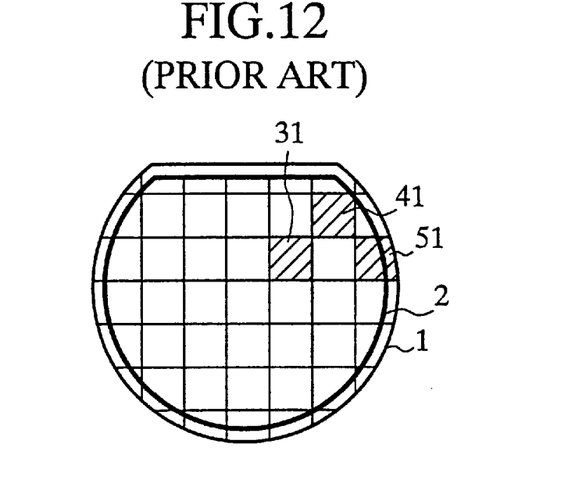
FIG. 12 is a plan view showing one example of a layout of a semiconductor wafer.

FIG. 12 is a plan view showing a semiconductor wafer on which a number of semiconductor chips with projecting electrodes (hereinafter, referred to as "bumps") are formed in such a manner as to be laid out as shown in the figure. In the figure, reference numeral 1 denotes a semiconductor wafer; 2 is a bump formation region; 31 is a semiconductor chip with 100% bumps, in which the bumps are perfectly formed on external connection pads; 41 is a semiconductor chip with 90% bumps, in which about 10% of the bumps are lacking; and 51 is a semiconductor chip with 70% bumps, in which about 30% of the bumps are lacking.

These semiconductor chips 31, 41 and 51 with bumps are fabricated by a process of forming circuit elements such as transistors on a semiconductor wafer by use of techniques such as chemical vapor deposition (CVD) and ion implantation; stacking, on the wafer, wirings for connecting the circuit elements to each other to form semiconductor devices; and forming, by use of a mask set in a bump formation region, a bump underlying metal layer, and projecting electrodes or bumps 6 made from gold or solder on external connection pads through processes of sputtering, electrolytic plating, or the like.

Figure 13:
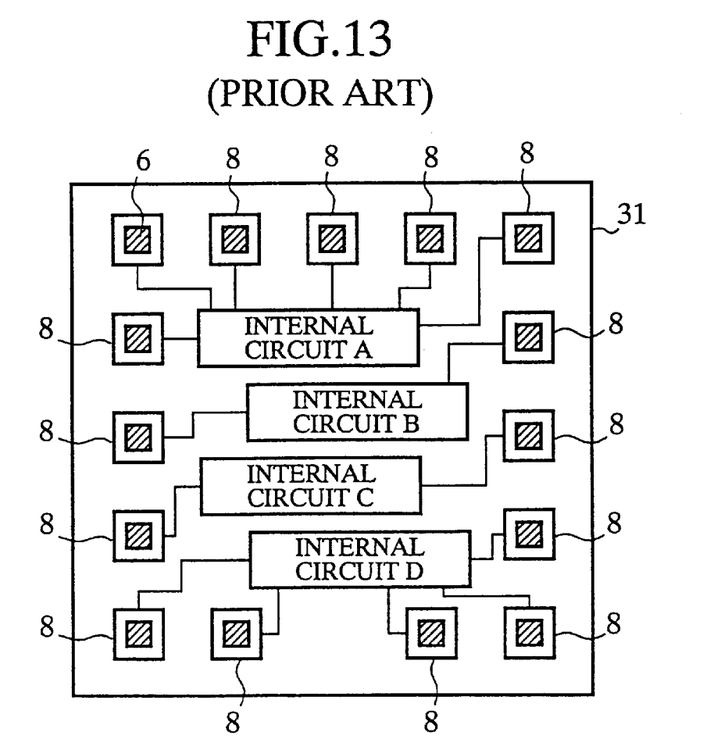
FIG. 13 is a plan view showing a prior art semiconductor chip with 100% bumps.
Figure 14:
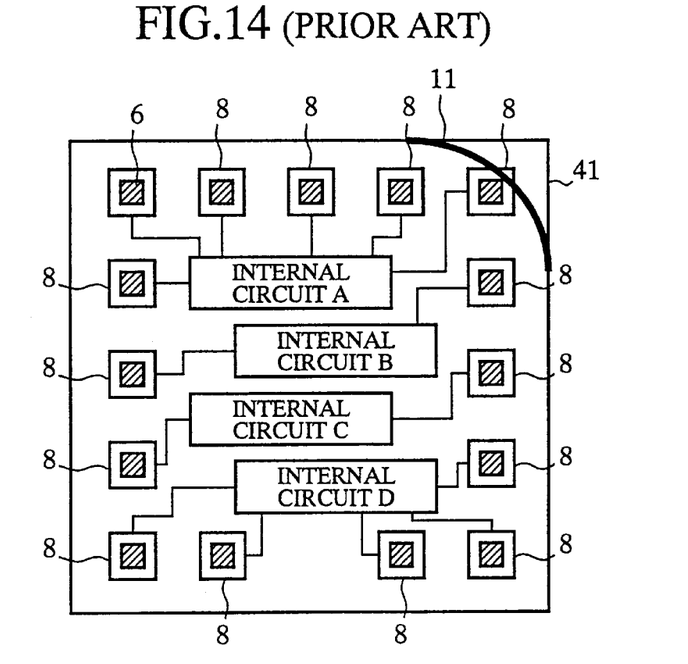
FIG. 14 is a plan view showing a prior art semiconductor chip with 90% bumps.
Figure 15:
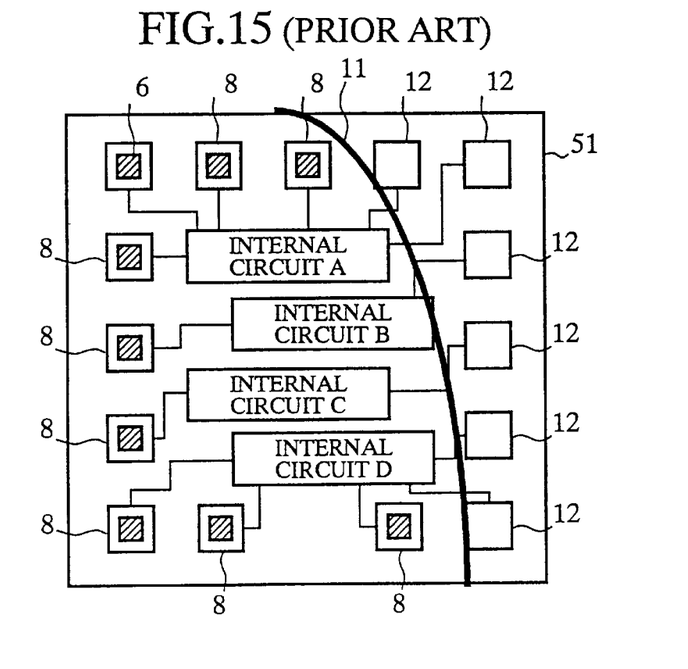
FIG. 15 is a plan view showing a prior art semiconductor chip with 70% bumps.

FIGS. 13 to 15 are plan views each showing a prior art configuration example of a semiconductor chip with bumps, wherein FIG. 13 shows a semiconductor chip with 100% bumps; FIG. 14 shows a semiconductor chip with 90% bumps; and FIG. 15 shows a semiconductor chip with 70% bumps. In these figures, like characters denote like components or corresponding parts, and the explanation thereof is omitted. Reference numeral 6 denotes a bump; 8 is an external connection pad with a bump; 11 is a boundary of the bump formation region 2 depicted on a large scale; and 12 is a bump non-formation pad.

Next, the operation will be described below.

Each of the semiconductor chips 31, 41 and 51 with bumps includes internal circuits A to D containing input/output buffers, logic circuits, and the like which are electrically connected to the external connection pads 8 for signal exchange via the external connection pads 8.

The prior art semiconductor chip with bumps and the inspecting method thereof, configured as described above, have problems. That is to say, upon bump formation, there may occur lacking bumps 6 at the boundary of the bump formation area, that is, at the bump formation region boundary 11 or at least one of four corners of each of the semiconductor chips 41 and 51 with bumps positioned at the periphery of a wafer, to form the bump non-formation pads 12 thereat, thereby reducing the reliability of integrated circuits (ICs) constituting semiconductor devices.

Conventionally, a semiconductor chip with bumps partially lacking upon bump formation has been selected in a wafer test by a manner of forming, on a semiconductor chip, positioned out of the bump formation region 2, a short-circuit bump unit 24 in which the bumps 6 are short-circuited to each other, and detecting the short-circuit bump unit 24 by an IF test performed at the beginning of a wafer test.

Figure 16:
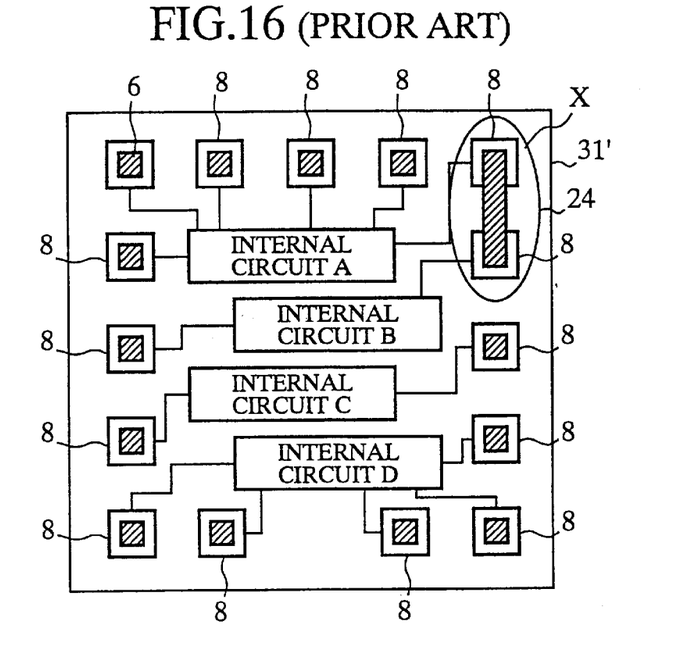
FIG. 16 is a plan view showing a prior art semiconductor chip with 100% bumps.
Figure 17:
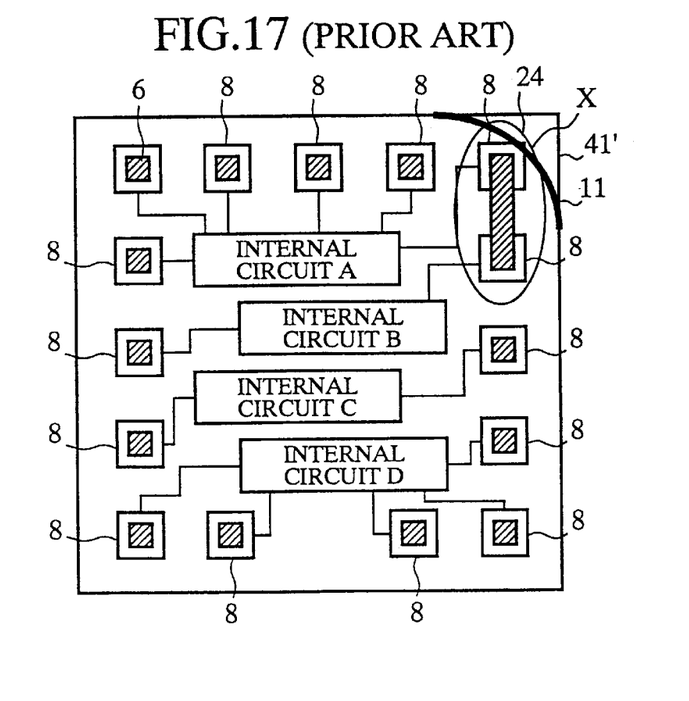
FIG. 17 is a plan view showing a prior art semiconductor chip with 90% bumps.
Figure 18:
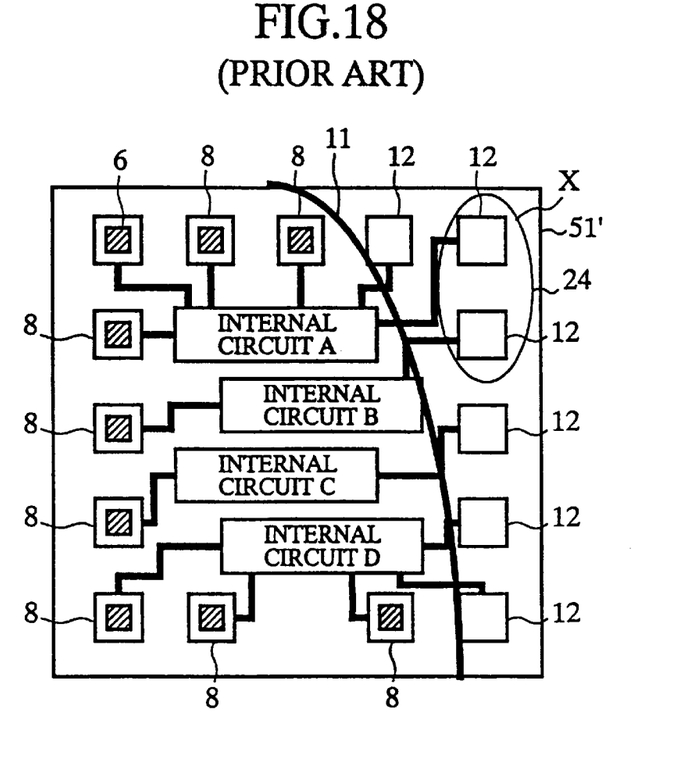
FIG. 18 is a plan view showing a prior art semiconductor chip with 70% bumps.

FIGS. 16 to 18 are plan views each showing a prior art semiconductor chip with short-circuit bump units, wherein FIG. 16 shows a semiconductor chip 31' with 100% short-circuit bump units; FIG. 17 shows a semiconductor chip 41' with 90% short-circuit bump units; and FIG. 18 shows a semiconductor chip 51' with 70% short-circuit bump unit. In these figures, like characters denote like components or corresponding parts, and the explanation thereof is omitted. Reference numeral 24 denotes a short-circuit bump unit, and character X is a region in which the short-circuit bump unit 24 is formed.

Even if the above short-circuit bump units are formed, however, there arises another problem. That is to say, as shown in FIGS. 15 to 18, for each of the semiconductor chips 41, 41' and 51, 51' positioned at the boundary of the bump formation region 2 of the semiconductor wafer 1, there is lacking the short-circuit bump unit itself due to lacking of the bumps 6, with a result that it fails to reject a chip with bumps 6, part of which are lacking, in the wafer test.

Since the semiconductor chip at the boundary of the bump-formation region 2 cannot be selected by the wafer test, the bump formation state of the chip must be manually determined after the wafer test, and if the chip is determined as a defective one, a defective mark must be manually recorded on the chip. In particular, when a large number of semiconductor chips are laid out on one semiconductor wafer, there occur problems such that it takes a lot of time for selection by visual inspection; the visual inspection cost becomes high; a defective chip is mixed into the subsequent step due to an oversight by manual inspection; and the reliability of ICs is reduced. The manual work may cause another problem in erroneous formation of a short-circuit bump unit on a semiconductor chip outside of the bump formation region 2. In such a case, the semiconductor chip, even if it has no problem in terms of electrical characteristic of ICs, is determined as a defective chip by the wafer test because of the presence of the short-circuit bump unit. This gives rise to an inconvenience that a non-defective chip is erroneously wasted.

The prior art semiconductor chip 41' with about 10% bumps lacking, which bumps are formed with short-circuit bump units, can be selected as a defective one by the IF test because the external connection pads 8 are short-circuited via the bumps 6.

On the contrary, although the prior art semiconductor chip 51' with bumps in which about 30% of the bumps based on the total area of the chip are lacking must be generally selected as a defective one for ensuring the reliability of the completed semiconductor device, it cannot be selected as a defective one. The reason for this is that since the short-circuit bump unit 24 is not formed in the region X, there is no problem in terms of contact of a probe in the wafer test irrespective of no formation of the bumps 6 on the external connection pads 8 because of the presence of the underlying pads, so that a desired result is erroneously obtained in the above IF test.

As a result, in the actual fabrication process, to select these defective products, the semiconductor chips 31, 41, 51 and 31', 41' and 51' having bumps are required to be visually inspected. Such a manual inspection, however, causes a variation in inspected results, and accordingly a chip, which should be selected as a defective one for maintaining the reliability of ICs, remains as a non-defective one, giving rise to a problem that there is a possibility of formation of a semiconductor device using such a defective chip in terms of lacking bumps.

In the above IF test, depending on the order of inspecting the portions at which bumps are lacking and the external connection pads 8, there is a possibility that the chip is determined as a defective one after inspection of a plurality of the good external connection pads 8 with bumps. In such a case, there arises a problem that the time required for inspecting the plurality of the good external connection pads 8 until the determination is wasted.

Figure 19A:
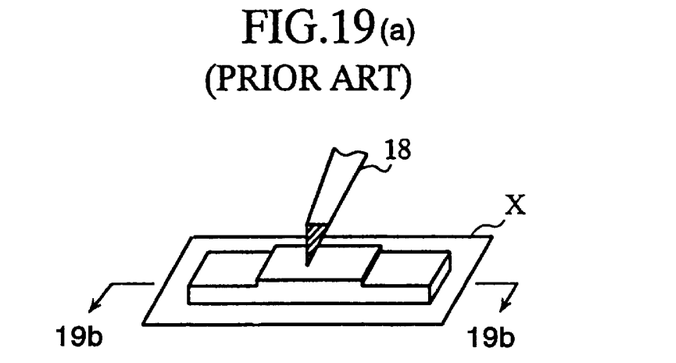
FIGS. 19(a) and 19(b) are perspective and cross-sectional views showing a configuration of a short-circuit bump unit in a region X of FIG. 16.
Figure 19B:
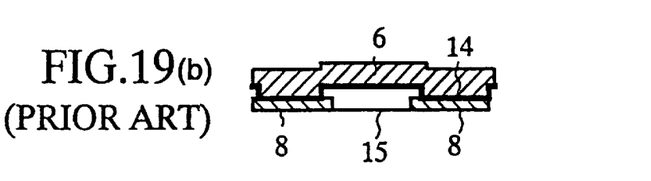

A schematic view showing a configuration of a short-circuit bump unit of the region X in FIG. 16, in which the perspective view of the short-circuit bump is shown in FIG. 19(*a*) and a sectional view taken on line 19*b*—19*b* is shown in FIG. 19(*b*). In these figures, like characters denote like components and corresponding parts, and the explanation thereof is omitted. Reference numeral 14 denotes a bump underlying metal as a buffer layer between the bump 6 and the external connection pad 8 laid under the bump 6; 15 is a protective film for preventing moisture absorption or the like stacked on the uppermost layer of the chip; and 18 is a probe used for the wafer test. The contact state of the probe is schematically shown in FIG. 19(*a*).

With this configuration, the shape of the bump 6 is affected by a step of the underlying structure due to a difference in height between the external connection pad 8 and the protective film 15, and has a step which is shown in FIG. 19(*b*). This causes a problem that there occur a variation in height of the bumps upon mounting of the semiconductor chip with bumps and a variation in contact pressure of the probe in the wafer test.

SUMMARY OF THE INVENTION

The present invention has been made to solve the above-described problems, and an object of the present invention is to provide a semiconductor chip with projecting electrodes or bumps, which is configured such that if bumps of the chip are partially lacking, such a chip can be easily determined as a defective one and that the surfaces of the bumps are flattened, and a method of inspecting the semiconductor chip with bumps.

To achieve the above object, according to an aspect of the present invention, there is provided a method of inspecting a semiconductor chip with projecting electrodes, including the steps of: measuring an electric characteristic of each of electrode terminals for detecting formation of projecting electrodes arranged along four corners of the peripheral edge of the semiconductor chip; and determining the semiconductor chip as a defective one in terms of formation of projecting electrodes if the measured result does not conform to a desired characteristic.

With this configuration, a chip with projecting electrodes or bumps part of which are lacked, occurring at the boundary of a bump formation region, can be automatically determined as a defective one by a wafer test without adoption of visual inspection. Thus, there can be obtained an effect of reducing a time required for visual inspection of semiconductor chips with projecting electrodes after the wafer test, thereby reducing the fabrication cost of the semiconductor chips with projecting electrodes.

According to an aspect of the present invention, there is provided a semiconductor chip with projecting electrodes, wherein an electrode terminal is prepared by opening a protective film as an underlying film for a projecting electrode together with upper portions of external connection pads under the projecting electrode and a region in which the electrode terminal is to be formed, and forming the electrode terminal in the opening portion, whereby the surface of the electrode terminal is flattened.

With this configuration, since such a step as to follow the irregularity of the protective film is not formed on the surface of the projecting electrode, there can be obtained an effect of equalizing the contact pressure of a probe when the probe is brought in contact with the surface of the projecting electrode upon the wafer test.

According to an aspect of the present invention, there is provided a semiconductor chip with projecting electrodes including: electrode terminals for detecting formation of projecting electrodes arranged at least two positions; and a projecting electrode detecting wiring arranged in such a manner as to be electrically connected to the electrode terminals and to extend, over the entire peripheral edge of the semiconductor chip, between the peripheral edge and positions at which external connection pads are formed.

With this configuration, non-defective/defective of the semiconductor chip with projecting electrodes can be automatically determined by the wafer test by connecting a probe to the electrode terminals for detecting formation of the projecting electrodes or projecting electrode detecting pads connected to the projecting electrode detecting wiring, and by comparing the result of measuring the electric characteristic with a desired characteristic. Accordingly, like the above effects, there can be obtained effects of shortening an inspecting time, and improving the reliability, for example, by preventing human error and mixing of a defective chip into the subsequent step.

According to an aspect of the present invention, there is provided a method of inspecting a semiconductor chip with projecting electrodes, including the steps of: measuring an electric characteristic of an electrode terminal for detecting formation of projecting electrodes and determining the semiconductor chip as a defective one if the measured result does not conform to a desired characteristic.

With this configuration, the chip with projecting electrodes part of which are lacked can be detected and determined as a defective one by the wafer test, and accordingly, like the above effects, there can be obtained an effect of reducing a time required for visual inspection of semiconductor chips with projecting electrodes after the wafer test, thereby reducing the fabrication cost of the semiconductor chips with projecting electrodes.

According to an aspect of the present invention, there is provided a method of inspecting a semiconductor chip with projecting electrodes, wherein an electrode terminal for detecting formation of projecting electrodes has a structure in which two external connection pads are to be short-circuited by formation of a projecting electrode, and if the connection between the two external connection pads cannot be perfectly short-circuited, the electric characteristic does not conform to a desired characteristic, and thus, the semiconductor chip is determined as a defective one in terms of formation of projecting electrodes.

With this configuration, there can be obtained an effect of automatically selecting chips with projecting electrodes part of which are lacked by the IF test performed at the beginning of the wafer test, thereby reducing the fabrication cost of the semiconductor chips with projecting electrodes.

According to an aspect of the present invention, there is provided a semiconductor chip with projecting electrodes, including a projecting electrode detecting wiring for electrically connecting an external connection pad arranged along the peripheral edge to an internal circuit via an electrode terminal for detecting formation of projecting electrodes.

With this configuration, since the chip with bumps part of which are lacked can be selected by comparison of an electric characteristic such as a diode characteristic with a desired characteristic in addition to the above-described IF test, there can be obtained an effect of improving the reliability of the inspection in addition to the above-described effects.

According to an aspect of the present invention, there is provided a method of inspecting a semiconductor chip with projecting electrodes, including the steps of measuring an electric characteristic across an electrode terminal for detecting formation of projecting electrodes via external connection pads, and determining the semiconductor chip as a defective one in terms of formation of projecting electrodes if the measured result does not conform to a desired characteristic.

With this configuration, the above IF test, a function test, and inspection of an electric characteristic such as a diode characteristic can be performed by making use of the projecting electrode detecting wiring. As a result, like the above effects, there can be obtained effects of shortening the inspecting time, preventing human error and mixing of a defective chip into the subsequent step, and improving the reliability of the inspection.

According to an aspect of the present invention, there is provided a method of inspecting a semiconductor chip with projecting electrodes, wherein an electrode terminal for detecting formation of projecting electrodes has a structure in which two external connection pads are short-circuited by formation of a projecting electrode; and it is measured whether the connection between the two external connection pads is opened or short-circuited and also a diode characteristic is measured, and if these electric characteristics do not conform to respective desired characteristics, the semiconductor chip is determined as a defective one in terms of formation of projecting electrodes.

With this configuration, a defective chip in terms of formation of projecting electrodes can be automatically selected in the wafer test by inspection of the diode characteristic in addition to the IF test, and accordingly, like the above effects, there can be obtained effects of shortening an inspecting time and improving the reliability of the inspection.

DETAILED DESCRIPTION OF THE PREFERRED EMBODIMENTS

Hereinafter, preferred embodiments of the present invention will be described with reference to the accompanying drawings.

Embodiment 1

Figure 1:
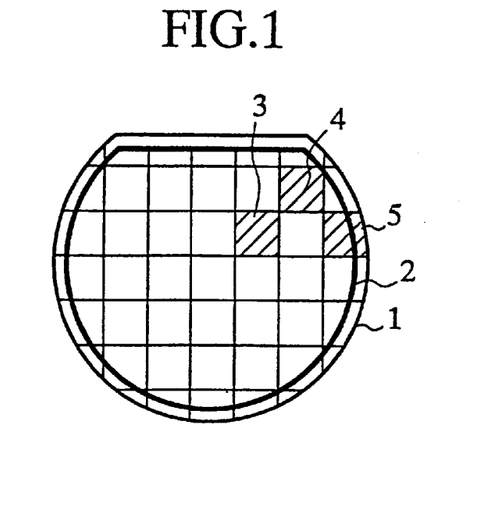
FIG. 1 is a plan view showing one example of a layout of a semiconductor wafer according to a first embodiment of the present invention.

FIG. 1 is a front view showing a semiconductor wafer in which a number of semiconductor chips with projecting electrodes (hereinafter, referred to as "bumps") according to the first embodiment of the present invention are laid out as shown in the figure. In FIG. 1, reference numeral 1 denotes a semiconductor wafer; 2 is a bump formation region; 3 is a semiconductor chip with bumps, in which the bumps are perfectly formed on external connection pads; 4 is a semiconductor chip with bumps, in which about 10% of the bumps are lacking; and 5 is a semiconductor chip with bumps, in which about 30% of the bumps are lacking.

The above-described semiconductor chips with bumps are fabricated by a process of forming circuit elements, such as transistors, on a semiconductor wafer using techniques such as chemical vapor deposition (CVD) and ion implantation; stacking on the wafer, wirings for connecting the circuit elements to each other to form semiconductor devices; forming, by use of a mask set in the bump formation region 2, bump underlying electrodes and bumps 6 made from gold or solder on external connection pads through processes of sputtering, electrolytic plating, or the like; and dicing the semiconductor wafer into individual chip products.

Figure 2:
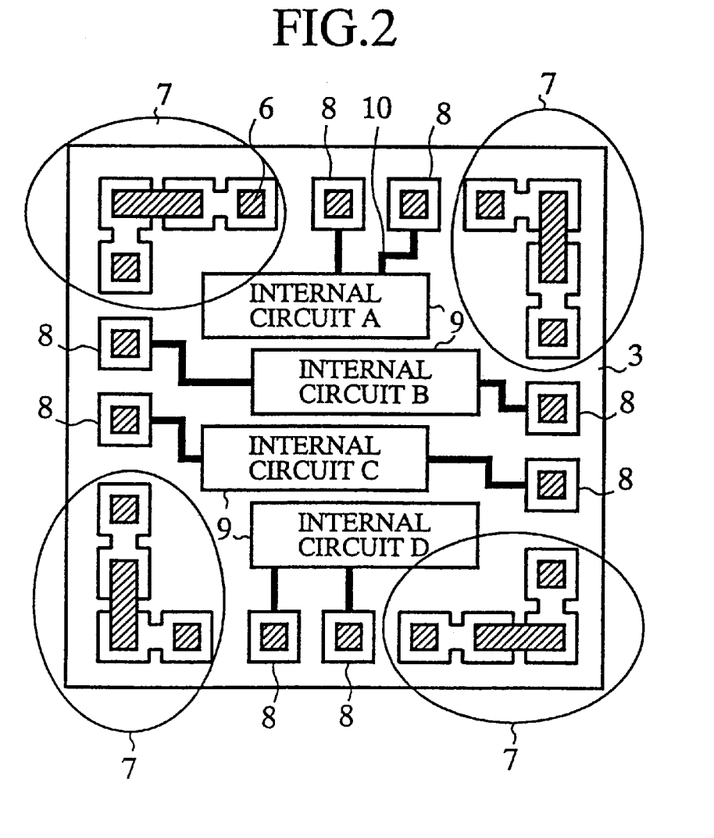
FIG. 2 is a plan view showing a semiconductor chip with 100% bumps according to the first embodiment of the present invention.
Figure 3:
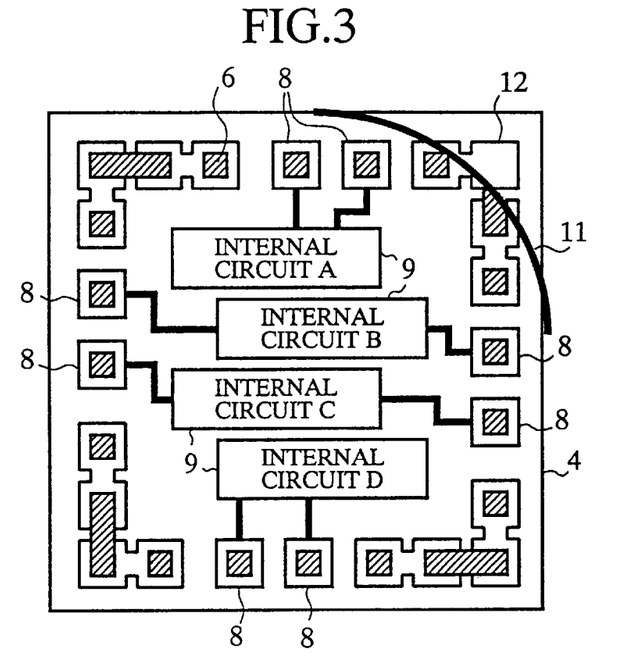
FIG. 3 is a plan view showing a semiconductor chip with 90% bumps according to the first embodiment of the present invention.
Figure 4:
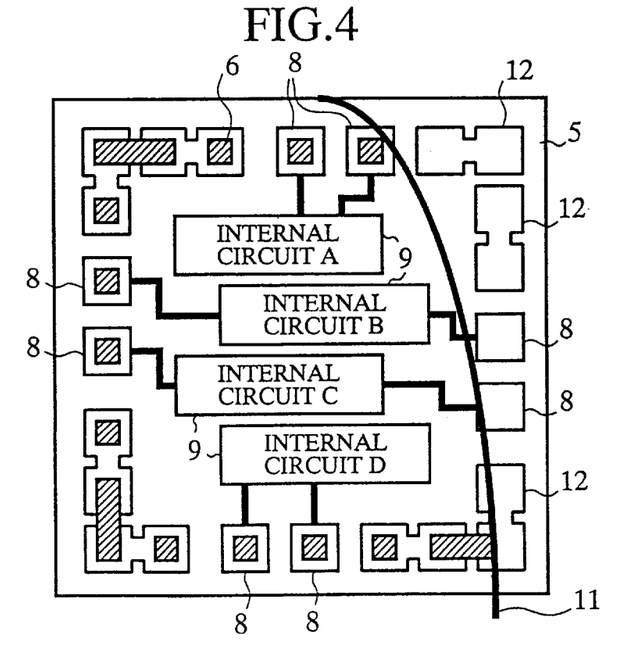
FIG. 4 is a plan view showing a semiconductor chip with 70% bumps according to the first embodiment of the present invention.

FIGS. 2 to 4 are plan views each showing a semiconductor chip with bumps according to the first embodiment of the present invention, wherein FIG. 2 shows a semiconductor chip 3 with 100% bumps; FIG. 3 is a semiconductor chip with 90% bumps; and FIG. 4 shows a semiconductor chip with 70% bumps.

The present invention will be described in detail below.

In FIG. 2, reference numeral 6 denotes a projecting electrode or bump; 7 is a bump detecting pad unit (electrode terminal for detecting formation of projecting electrodes) in which two pads are short-circuited to each other via a bump; 8 is an external connection pad on which a bump is formed; 9 is an internal circuit; and 10 is an external input/output wiring for connecting the external connection pad 8 to the internal circuit 9. In FIG. 3, reference numeral 11 denotes a boundary of the bump formation region 2, shown in FIG. 1, depicted on a large scale; and 12 is a bump non-formation pad which is positioned out of the bump formation region and which is formed with no bump.

The operation will be described below.

Each of the semiconductor chips 3, 4 and 5 with bumps includes internal circuits A to D containing input/output buffers and logic circuits electrically connected to the external connection pads 8 for signal exchange via the external connection pads 8.

A method of inspecting the semiconductor chips 3, 4 and 5 with bumps will be described below.

In the test, a wafer testing probe is sequentially brought in contact with each of the bump detecting pad units 7 provided at the four corners of the chip, to sequentially measure an characteristic of each bump detecting pad unit 7. Thus, it is checked whether or not the bump is perfectly formed on each of the bump detecting pad units 7 provided at the four corners of each of the semiconductor chips 3, 4 and 5 with bumps by inspecting whether the connection between the two external connecting pads 6 of each bump detecting pad unit 7 is open or short-circuited, to thereby determine whether each of the semiconductor chips 3, 4 and 5 with bumps is non-defective or defective.

In this inspection, for the semiconductor chip 3 with bumps shown in FIG. 2, since the bump 6 is perfectly formed on each of the bump detecting pad units 7 provided at the four corners of the chip, the measured result shows a short-circuit between the two external connection pads 8 of each of the bump detecting pad units 7 at the four corners of the chip. As a result, for the semiconductor chip 3 with bumps, it is determined that all of the bumps 6 are perfectly formed on the external connection pads 8 without any lacking. That is to say, the chip 3 is regarded acceptable in this inspection and is allowed to go on to the IC assembling step.

For each of the semiconductor chips 4 and 5 shown in FIGS. 3 and 4, of the bump detecting pad units 7 provided at the four corners, one pad unit 7 provided on the semiconductor chip 4 shown in FIG. 3 it is a defective pad unit in which the bump 6 is lacking and the bump non-formation pad 12 is exposed. Two pad units 7 provided on the semiconductor chip 5 shown in FIG. 4 are defective pad units, and accordingly, the inspected result shows that the connection between the two external connection pads 8 of the above defective bump detecting pad unit 7 is open. It is determined that all of the bumps 6 of each of the semiconductor chips 4 and 5 with bumps are not perfectly formed on the external connection pads 8. Therefore, the entire chip is regarded unacceptable in this inspection.

In this way, the bump detecting pad units 7 at the four corners of each of the semiconductor chips 3, 4 and 5 are inspected, and if at least one of the bump detecting pad units 7 is regarded as unacceptable, it is determined that all of the bumps 6 are not formed on the external connection pads 8. In this case, the entire chip can be regarded unacceptable in the wafer test.

Conventionally, chips have been selected by visually inspecting whether or not the bumps have been perfectly formed; however, as described above, according to the first embodiment, the inspection can be automatically performed in place of visual inspection. As a result, there can be obtained effects of shortening inspecting time, preventing human error and mixing of a chip with defective bumps into the subsequent step, and improving the reliability of the inspection.

Embodiment 2

Figure 5A:
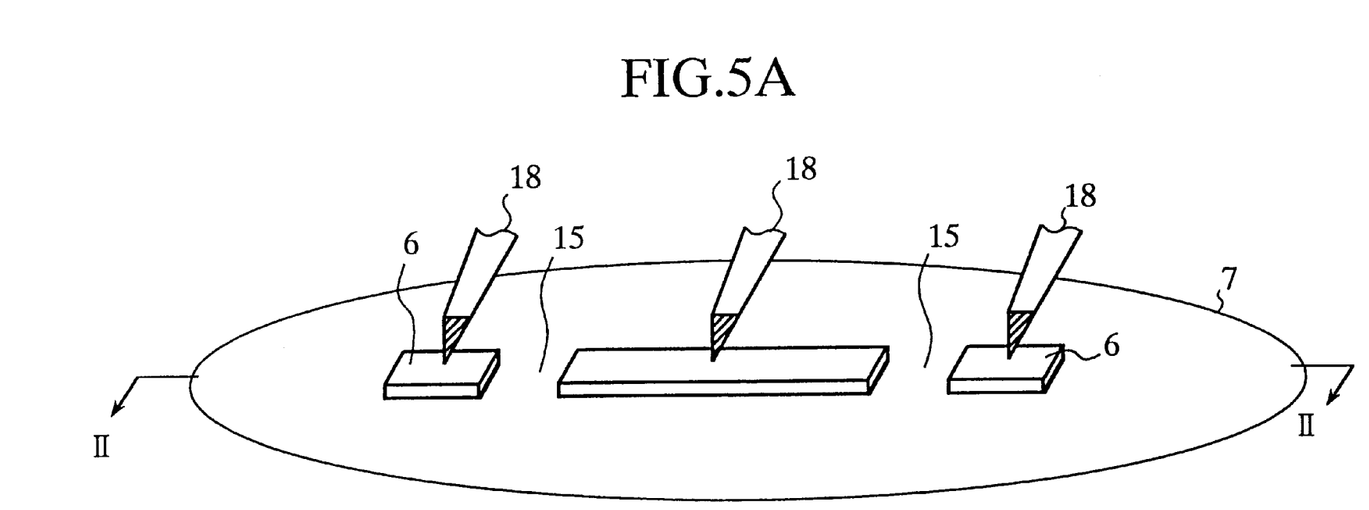
FIGS. 5A and 5B are views showing a structure of a bump detecting pad unit according to a second embodiment of the present invention.
Figure 5B:
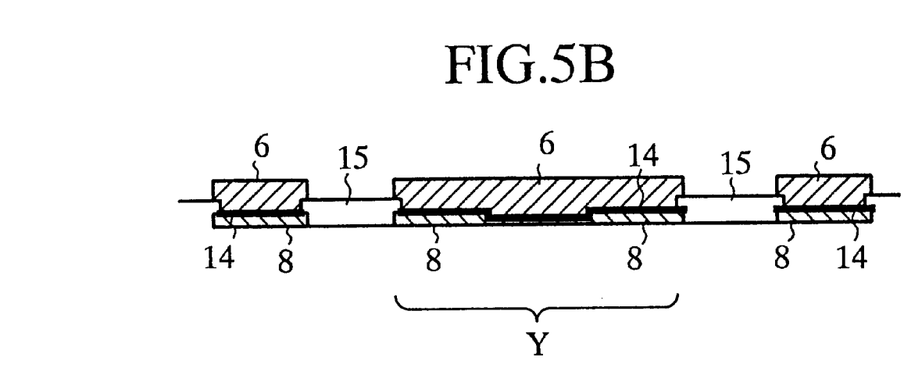

FIG. 5A is a partially enlarged view showing one example of a bump detecting pad unit 7 of a semiconductor chip with bumps according to the second embodiment of the present invention; and FIG. 5B is a sectional view taken along line 5B—5B of FIG. 5A. In these figures, like characters denote like components or corresponding parts, and the explanation thereof is omitted. Reference numeral 14 denotes a bump underlying metal as a buffer layer provided between a bump 6 and external connection pads 8 laid under the bump 6; 15 is a protective film for preventing moisture absorption stacked on the uppermost layer of a chip; 18 is a probe used for a wafer test; and Y is a short-circuit bump unit formation region. FIG. 5A schematically shows a state in which the probe is in contact with the bump 6. It is to be noted that the bump detecting pad unit 7 actually has a pattern bent 90° at its center as shown in FIGS. 2 to 4; however, it is schematically depicted as straightened in FIGS. 5A and 5B.

As shown in FIG. 5B, the bump pad structure of the short-circuit bump unit formation region Y provided at the central portion of the bump detecting pad unit 7 of the semiconductor chip with bumps is prepared by a method in which the protective film 15 is covered after formation of the external connection pads 8 by etching using a photomask. The external connection pads 8, bump underlying metal 14 and the bump 6 formation region are simultaneously partially removed by etching. That is to say, a portion of the protective film 15 where the external connection pads 8 are not present is removed by etching, and then the bump underlying metal 14 and the bump 6 are sequentially formed in the opening portion. Accordingly, the surface of the bump 6 in the region Y is flattened without being affected by the thickness of the protective film 15.

The operation will be described below.

With the probe brought in contact with the location at which the bump 6 is formed to start the wafer test, the contact pressure of the probe is equalized because the surface of the bump 6 is flattened in the region Y in which the short-circuit bump unit is formed and further the bump 6 is at the same level as that of another bump 6.

As described above, according to the second embodiment, since the surface of the bump is flattened in the region Y in which the short-circuit bump unit is formed, there can be obtained effects of eliminating a variation in height of the bumps upon mounting of the semiconductor devices with bumps and equalizing the contact pressure of the probe upon performing the wafer test.

Embodiment 3

Figure 6:
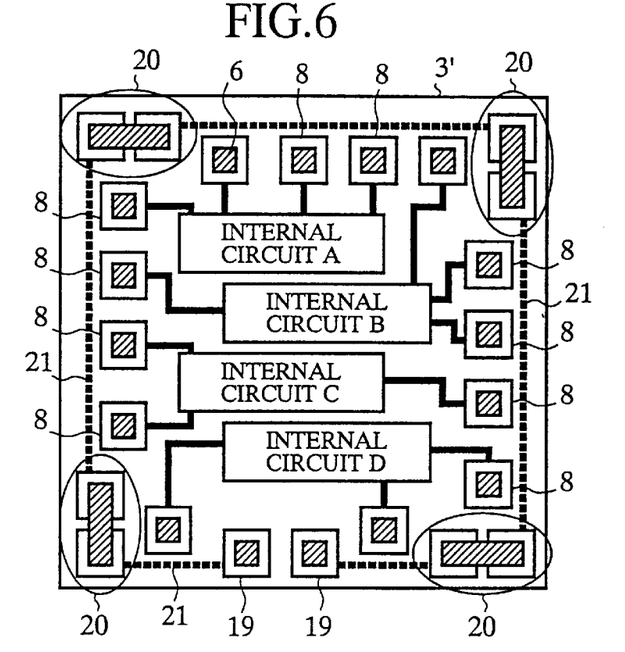
FIG. 6 is a plan view showing a semiconductor chip with 100% bumps according to a third embodiment of the present invention.
Figure 7:
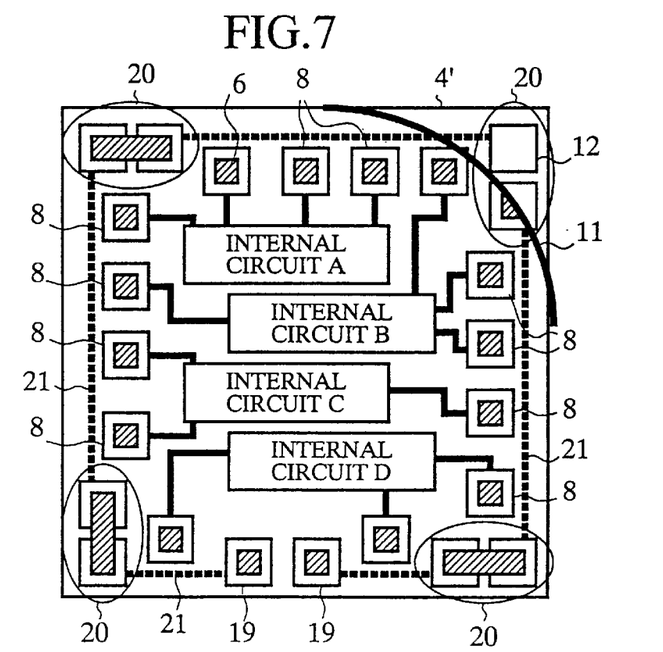
FIG. 7 is a plan view showing a semiconductor chip with 90% bumps according to the third embodiment of the present invention.
Figure 8:
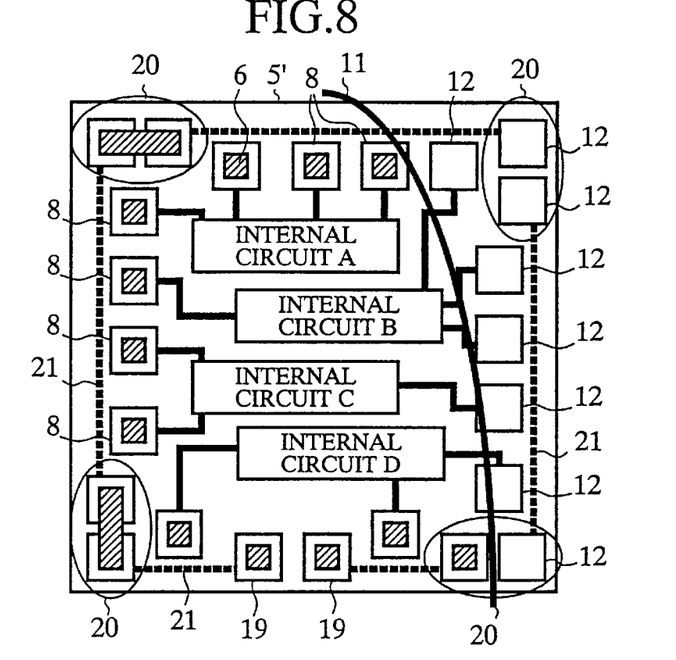
FIG. 8 is a plan view showing a semiconductor chip with 70% bumps according to the third embodiment of the present invention.

FIGS. 6 to 8 are plan views each showing a semiconductor chip with bumps according to the third embodiment of the present invention, wherein FIG. 6 shows a semiconductor chip 3' with 100% bumps; FIG. 7 shows a semiconductor chip 4' with 90% bumps; and FIG. 8 shows a semiconductor chip 5' with 70% bumps.

The present invention will be described in detail below.

In these figures, like characters denote like components and corresponding parts, and the explanation thereof is omitted. Reference numeral 19 denotes a bump detecting test pad; 20 is a bump detecting bump unit (electrode terminal for detecting formation of projecting electrodes) provided at each of four corners of the chip; and 21 is a bump detecting wiring (projecting electrode detecting wiring) arranged in such a manner as to electrically connect the bump detecting pad units 20 provided at the four corners of the chip to each other and extending, over the entire peripheral edge of the chip, between the peripheral edge and positions at which external connection pads are formed. The operation is the same as that described in the first embodiment, and the explanation thereof is omitted.

A method of inspecting the semiconductor chips 3', 4' and 5' with bumps will be described below.

The test for determining whether the semiconductor chip with bumps is non-defective or defective is performed by bringing a probe in contact with both the bump detecting test pads 19 to inspect whether the connection between the two pads 19 is open or short-circuited. In this inspection, for the semiconductor chip 3' with bumps shown in FIG. 6, since each bump is perfectly formed on the bump detecting pad unit 20 at each corner of the chip, the measured result shows that the connection between the two bump detecting test pads 19 is short-circuited. That is to say, it is determined that all of the bumps 6 are perfectly formed on the external connection pads 8 without any lacking, and accordingly, the semiconductor chip 3' with bumps is regarded acceptable in this inspection and is allowed to go on to the subsequent IC assembling step.

For each of the semiconductor chips 4' and 5' shown in FIGS. 7 and 8, of the bump detecting pad units 20 provided at the four corners of the chip and electrically connected to each other via the bump detecting wiring 21, one pad unit 20 is provided on the semiconductor chip 4' shown in FIG. 7 as a defective pad unit in which the bump 6 is lacking and the bump non-formation pad 12 is exposed and two pad units 20 are provided on the semiconductor chip 5' shown in FIG. 8 as defective pad units, and accordingly, it is detected by inspection that the connection between the two detecting test pads 19 is open. Accordingly, for each of the semiconductor chips 4' and 5' with bumps, it is determined that all of the bumps are not perfectly formed on the external connection pads 8. In this case, each of the semiconductor chips 4' and 5' with bumps is regarded as unacceptable in this inspection.

In this way, the bump detecting pad units 20 provided at the four corners and electrically connected with each other via the bump detecting wiring 21 in the semiconductor chip with bumps are inspected, and if it is detected that the bump 6 is lacking at at least one of the bump detecting pad units 20, it is determined that the connection between the bump detecting test pads 19 is open and is regarded unacceptable. In this case, it is determined that all of the bumps 6 are not perfectly formed on the external connection pads 8, and the semiconductor chip with bumps can be regarded as unacceptable in the wafer test.

Conventionally, chips have been selected by visual inspection to determine whether or not the bumps 6 have been perfectly formed; however, as described above, according to the third embodiment, the above determination can be automatically performed. As a result, there can be obtained effects of shortening an inspecting time, preventing human error and mixing of a chip with defective bumps into the subsequent step because of no manual inspection, and improving the reliability of the inspection.

Embodiment 4

Figure 9:
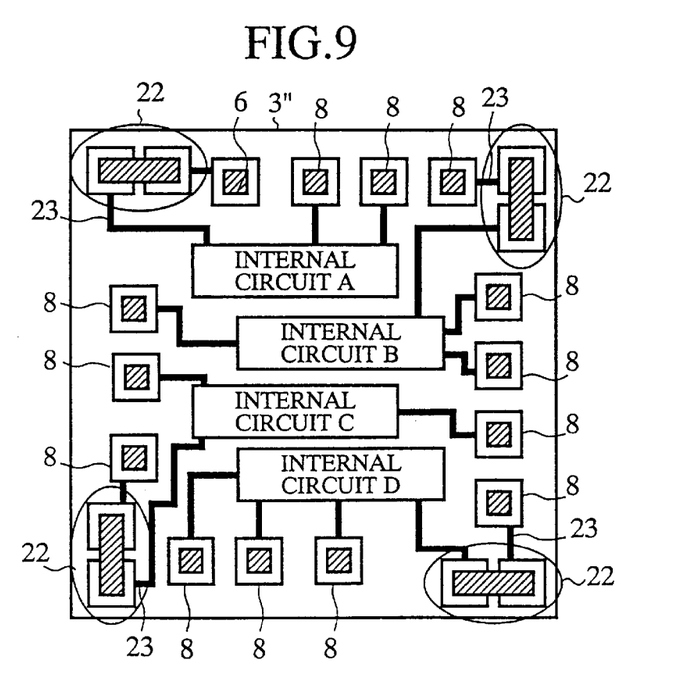
FIG. 9 is a plan view showing a semiconductor chip with 100% bumps according to a fourth embodiment of the present invention.
Figure 10:
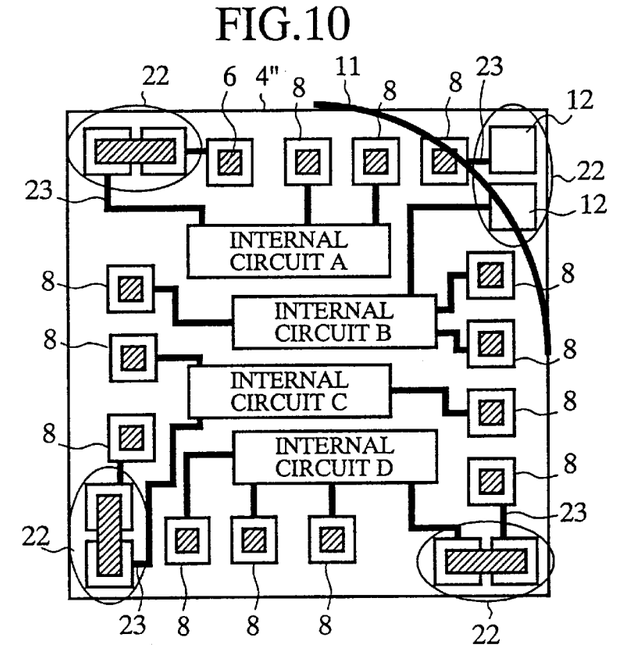
FIG. 10 is a plan view showing a semiconductor chip with 90% bumps according to the fourth embodiment of the present invention.
Figure 11:
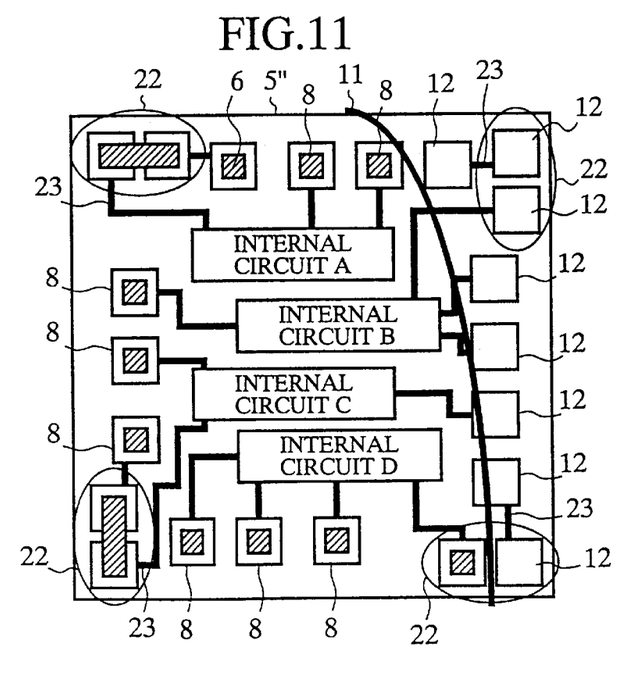
FIG. 11 is a plan view showing a semiconductor chip with 70% bumps according to the fourth embodiment of the present invention.

FIGS. 9 to 11 are plan views each showing a semiconductor chip with bumps according to the fourth embodiment of the present invention, wherein FIG. 9 shows a semiconductor chip 3" with 100% bumps; FIG. 10 shows a semiconductor chip 4" with 90% bumps; and FIG. 11 shows a semiconductor chip 5" with 70% bumps.

The present invention will be described in detail below.

In these figures, like characters denote like components and corresponding parts, and the explanation thereof is omitted. Reference numeral 22 denotes a bump detecting pad unit (electrode terminal for detecting formation of projecting electrodes) provided at each of four corners of the chip; 23 is a bump detecting wiring (projecting electrode detecting wiring) for electrically connecting an internal circuit to an external connection pad 8 via the bump detecting pad unit 22. It is to be noted that the operation is the same as that described in the first embodiment, and the explanation thereof is omitted.

A method of inspecting the semiconductor chips 3", 4" and 5" with bumps will be described below.

First, a probe is brought in contact with the external connection pads 8 with bumps, to perform a test for checking an electrical characteristic of the semiconductor chip, for example, the IF test. The measured result is compared with a desired electrical characteristic such as a diode characteristic, to determine whether the semiconductor chip with bumps is non-defective or defective.

In this inspection, for the semiconductor chip 3" with bumps shown in FIG. 9, since each bump is perfectly formed on the bump detecting pad unit 22 at each of the four corners of the chip, each external connection pad 8 with a bump is connected to one of the internal circuits A to D via the bump detecting pad unit 22 and the bump detecting wiring 23, with a result that the diode characteristic can be detected. That is to say, for the semiconductor chip 3" with bumps, it is determined that all of the bumps 6 are perfectly formed on the external connection pads 8 without any lacking. In this case, the semiconductor chip 3" with bumps is regarded as acceptable in this inspection and is allowed to go on to the IC assembling step.

For each of the semiconductor chips 4" and 5" with bumps shown in FIGS. 10 and 11, the external connection pads 8 are connected to one of the internal circuits A to D via the bump detecting wiring. Of the bump detecting pad units provided at the four corners of the chip, one pad unit is lacking in the semiconductor chip 4" shown in FIG. 10 and two pad units are lacking in the semiconductor chip 5" shown in FIG. 11. In such a circuit containing the defective bump detecting pad unit, since the external connection pads 8 with bumps are not connected to the corresponding one of the internal circuits A to D, the connection between the external connection pads 8 is open, and thereby no diode characteristic can be obtained. Such a circuit can be also determined unacceptable by another electrical characteristic test. As a result, for each of the semiconductor chips 4" and 5" with bumps, it is determined that all of the bumps are not perfectly formed on the external connection pads 8. In this case, each of the semiconductor chips 4" and 5" with bumps is regarded as unacceptable in this inspection.

In this way, the connection between the external connection pads 8 with bumps connected to one of the internal circuits A to D via the bump detecting wiring 23 is detected by the IF method, and if one bump of at least one of the bump detecting pad units provided at the four corners of the chip is lacking, the circuit containing the defective bump detecting pad unit fails to exhibit any diode characteristic in the IF test and is regarded as unacceptable. In this case, it is determined that all of the bumps are not perfectly formed on the external connection pads, and therefore, the semiconductor chip with the bumps can regarded as unacceptable in the wafer test. The above determination can be made by another function test.

Conventionally, it has been determined by visual inspection whether or not the bumps are perfectly formed; however, as described above, according to the fourth embodiment, the above determination can be automatically performed. As a result, there can be obtained effects of shortening an inspecting time, preventing human error and mixing of a chip with defective bumps into the subsequent step because of no manual work for inspection, and improving the reliability of the inspection.

What is claimed is:

1. A semiconductor chip with projecting electrodes for detecting electrode defects comprising:

a semiconductor chip having a surface with a peripheral edge having four corners;

projecting electrode projecting outward from the surface for detecting whether a pair of projecting electrodes is present at each of the four corners of the semiconductor chip; and respective projecting electrode detecting wiring for electrically connecting first and second projecting electrodes of each pair of projecting electrodes whereby presence of the electrode detecting wiring and the first and second projecting electrodes at each corner of the semiconductor chip may be independently determined from electrical continuity between the first and second projecting electrodes of the pair of projecting electrodes at the corner.

2. A semiconductor chip with projecting electrodes for detecting electrode defects comprising:

a semiconductor chip having a surface with a peripheral edge having four corners;

projecting electrode projecting outward from the surface for detecting whether a pair of projecting electrodes is present at at all of the four corners of the peripheral edge of the semiconductor chip; and projecting electrode detecting wiring including respective projecting electrode wiring for electrically connecting first and second projecting electrodes of each pair of projecting electrodes, two spaced apart electrode pads, and defect detecting wiring for electrically connecting in series the pairs of projecting electrodes, the defect detecting wiring being arranged along the peripheral edge of said semiconductor chip and terminating at the two electrode pads whereby presence of all of the pairs of projecting electrodes at all four corners of the semiconductor chip and the electrode detecting wiring may be determined from electrical continuity between the two electrode pads.

3. A semiconductor chip with projecting electrodes for detecting electrode defects comprising:

a semiconductor chip having a surface with a peripheral edge having four corners;

a plurality of internal circuits located on the surface of the semiconductor chip;

projecting electrodes projecting outwardly from the surface for detecting whether a pair of projecting electrodes is present at each of the four corners of the semiconductor chip, a first of the projecting electrodes of each pair of first and second projecting electrodes being directly connected to a respective one of the internal circuits by wiring on the semiconductor chip;

a plurality of first electrode pads disposed along the periphery of the semiconductor chip, each of the external circuits being directly connected to a respective electrode pad by wiring on the semiconductor chip;

a plurality second electrode pads disposed on the semiconductor chip proximate the periphery, one of the second electrode pads corresponding to each of the pair of projecting electrodes being electrically connected to the second projecting electrode of the corresponding pair of projecting electrodes, the second projecting electrode and the second electrode pad being directly connected by wiring on the semiconductor chip; and electrode detecting wiring for electrically connecting the first and second projecting electrodes of each pair of projecting electrodes whereby presence of the electrode detecting wiring and the pair of projecting electrodes at each corner of the semiconductor chip may be determined by electrically testing one of the internal circuits through one of the first electrode pads and one of the second electrode pads.

* * * * *